(12) United States Patent
Kanazawa et al.

(10) Patent No.: US 11,042,177 B2
(45) Date of Patent: Jun. 22, 2021

(54) VOLTAGE-CURRENT CONVERSION CIRCUIT AND CHARGE-DISCHARGE CONTROL DEVICE

(71) Applicant: ABLIC Inc., Tokyo (JP)

(72) Inventors: Yusuke Kanazawa, Tokyo (JP); Yoichi Suto, Tokyo (JP)

(73) Assignee: ABLIC INC., Tokyo (JP)

( * ) Notice: Subject to any disclaimer, the term of this patent is extended or adjusted under 35 U.S.C. 154(b) by 0 days.

(21) Appl. No.: 16/903,032

(22) Filed: Jun. 16, 2020

(65) Prior Publication Data

US 2020/0401171 A1    Dec. 24, 2020

(30) Foreign Application Priority Data

Jun. 21, 2019 (JP) .............................. JP2019-115049

(51) Int. Cl.
*G05F 1/52* (2006.01)
*G05F 1/56* (2006.01)
*G05F 3/22* (2006.01)
*G05F 3/26* (2006.01)
*H02M 3/156* (2006.01)

(52) U.S. Cl.
CPC ............... *G05F 1/561* (2013.01); *G05F 1/52* (2013.01); *G05F 3/227* (2013.01); *G05F 3/262* (2013.01); *H02M 3/156* (2013.01)

(58) Field of Classification Search
CPC ... G05F 1/561; G05F 1/52; G05F 3/02; G05F 3/08; G05F 3/20; G05F 3/205; G05F 3/227; G05F 3/24; G05F 3/26; G05F 3/262
See application file for complete search history.

(56) References Cited

U.S. PATENT DOCUMENTS

| 4,300,091 A * | 11/1981 | Schade, Jr. ............. G05F 3/265 323/315 |
| 10,054,974 B1 | 8/2018 | Koe |
| 10,819,331 B1 * | 10/2020 | Fabrie .................. H03K 17/162 |
| 2009/0179650 A1 | 7/2009 | Omagari |
| 2018/0172771 A1 | 6/2018 | Miyamoto et al. |

FOREIGN PATENT DOCUMENTS

| EP | 0607614 A2 | 7/1994 |
| JP | 63169113 | 7/1988 |
| JP | 2018-099020 A | 6/2018 |

OTHER PUBLICATIONS

EPO Communication including extended European search report in European Application No. 20 18 0905 dated Sep. 30, 2020 (11 pages).
Kumar A et al: "A Power-Performance Adaptive Low Voltage Analog Circuit Design Using Independently Controlled Double Gate CMOS Technology", May 23, 2004 (4 pages).

* cited by examiner

*Primary Examiner* — Long Nguyen
(74) *Attorney, Agent, or Firm* — Brinks, Gilson & Lione

(57) ABSTRACT

A voltage-current conversion circuit includes a voltage-current conversion resistor connected to an input terminal, and a current mirror circuit which mirrors a current supplied from the voltage-current conversion resistor, wherein the current mirror circuit is constructed to include a depletion-type transistor whose source voltage is biased to be higher than the substrate voltage.

5 Claims, 3 Drawing Sheets

VOLTAGE-CURRENT CONVERSION CIRCUIT AND CHARGE-DISCHARGE CONTROL DEVICE

RELATED APPLICATIONS

This application claims priority to Japanese Patent Application No. 2019-115049, filed on Jun. 21, 2019, the entire content of which is incorporated herein by reference.

BACKGROUND OF THE INVENTION

1. Field of the Invention

The present invention relates to a voltage-current conversion circuit and a charge-discharge control device.

2. Description of the Related Art

Inventions are disclosed regarding a circuit for detecting a circuit failure by itself regardless of the failure position and the failure mode in a charge-discharge control device for controlling charging and discharging of a secondary battery, and a failure diagnosis method therefor (for example, Japanese Patent Application Laid-Open No. 2018-099020).

FIG. 2 is a block diagram illustrating a charge-discharge control device including a failure diagnosis circuit.

A charge-discharge control device 100 includes a voltage-current conversion circuit 11, switches 12, 15, 16, a resistance circuit 13, reference voltage circuits 14, 38, comparators 17, 18, a current-voltage conversion circuit 31, operational amplifiers 32, 35, MOS transistors 33, 36, resistors 34, 37, and a current mirror circuit 39.

The comparator 17 detects over-discharge of a secondary battery B1 based on the voltage supplied from the resistance circuit 13 and the voltage of the reference voltage circuit 14. Likewise, the comparator 18 detects over-discharge of the secondary battery B1. Though not illustrated here, a control circuit and the like for controlling the charging and discharging of the secondary battery by signals from these comparators are also included.

In diagnosing failure of the circuit for detecting the voltage of the secondary battery B1, the charge-discharge control device 100 uses the voltage-current conversion circuit 11 and the current-voltage conversion circuit 31 to convert the voltage of the secondary battery B1 to a voltage based on the ground voltage and make a current based on the voltage flowing through the resistance circuit 13 by means of the switches 15, 16 in order to detect the failure of the circuit.

The operational amplifier 32, the MOS transistor 33, and the resistor 34 constitute a voltage-current conversion circuit. The operational amplifier 35, the enhancement-type MOS transistor 36, and the resistor 37, similarly, constitute a voltage-current conversion circuit.

In the charge-discharge control device 100, the voltage-current conversion circuit 11 is generally constructed by using an operational amplifier and an N-channel enhancement-type MOS transistor as described above.

However, in such a voltage-current conversion circuit as described above, when the gate voltage of the N-channel enhancement-type MOS transistor becomes low due to a drop in the voltage of the secondary battery B1, the accuracy of failure detection decreases since the voltage cannot be converted accurately to the current.

SUMMARY OF THE INVENTION

The present invention is to provide a voltage-current conversion circuit capable of converting an input voltage to a current and supplying the current accurately when the input voltage is low.

The present invention is also to provide a charge-discharge control device having such a failure diagnosis function that the detection accuracy does not decrease when the voltage of a secondary battery is low.

A voltage-current conversion circuit according to an embodiment of the present invention includes a voltage-current conversion resistor connected to an input terminal; and a current mirror circuit which mirrors a current supplied from the voltage-current conversion resistor, in which the current mirror circuit is constructed to include a depletion-type transistor whose source voltage is biased higher than the substrate voltage.

A charge-discharge control device according to the embodiment of the present invention includes a failure diagnosis circuit including the above-mentioned voltage-current conversion circuit and a current-voltage conversion circuit which converts the current of the voltage-current conversion circuit to a voltage based on a ground terminal.

According to the present invention, a voltage-current conversion circuit capable of converting a voltage to a current accurately even to a low voltage can be provided.

According to the present invention, a charge-discharge control device having a failure diagnosis function without a decrease in detection accuracy even at a low battery voltage can also be provided.

DETAILED DESCRIPTION OF THE PREFERRED EMBODIMENTS

Embodiments for carrying out the present invention will be described in detail with reference to the accompanying drawings.

Figure 1:
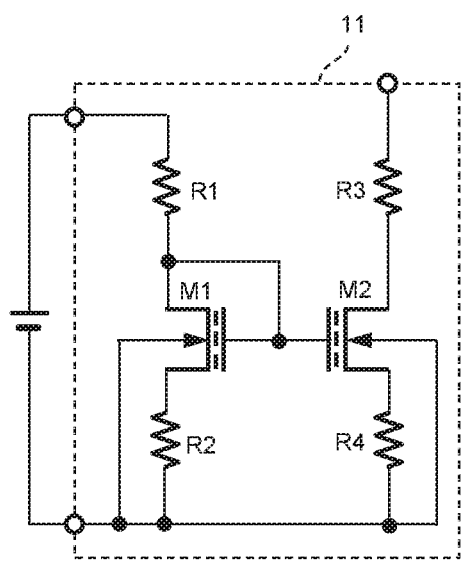
FIG. 1 is a circuit diagram illustrating a voltage-current conversion circuit according to an embodiment of the present invention.

FIG. 1 is a circuit diagram illustrating a voltage-current conversion circuit 11 according to an embodiment of the present invention.

The voltage-current conversion circuit 11 includes resistors R1, R2, R4, a resistor R3 as a load resistor, N-channel depletion-type transistors M1, M2, a first voltage input terminal on a high-potential side, a second voltage input terminal on a low-potential side, and a current output terminal.

The resistor R1 has one end connected to the first voltage input terminal and the other end connected to the drain and the gate of the transistor M1. The transistor M1 has a substrate connected to the second voltage input terminal and a source connected to one end of the resistor R2. The other end of the resistor R2 is connected to the second voltage input terminal.

The resistor R3 has one end connected to the current output terminal and the other end connected to the drain of the transistor M2. The transistor M2 has a gate connected to the gate and drain of the transistor M1, a source connected to one end of the resistor R4, and a substrate connected to the second voltage input terminal. The other end of the resistor R4 is connected to the second voltage input terminal.

The operation of the voltage-current conversion circuit 11 will next be described.

The resistor R1 is a resistor for voltage-current conversion to convert a voltage between the first voltage input terminal and the second voltage input terminal into a current. The transistor M1 and the resistor R2, and the transistor M2, and the resistor R4 constitute a current mirror circuit to mirror the current flowing through the resistor R1.

In the case where the current mirror circuit is constructed from N-channel depletion-type transistors, since the threshold voltage is negative, current mirror operation works even at a low voltage between the input terminals but cannot work at a low current. The current mirror circuit in FIG. 1 includes the resistor R2 and the resistor R4 as bias resistors for the transistor M1 and the transistor M2, respectively. Since the source potentials of the transistors M1, M2 are biased by the resistors R2, R4 at potentials higher than the substrate potential, the threshold voltages of the transistors increase due to the substrate bias effect.

Here, the threshold voltages of the transistors M1, M2 are set higher than 0 V and lower than those of enhancement-type transistors. These setting of the threshold voltages thus enables the current mirror operation in the current mirror circuit of FIG. 1 even at a low voltage between the input terminals and even at a low current.

The resistor R3 as the load resistor is so provided that the drain voltages of the transistor M1 is substantially equal to that of the transistor M2. The current flowing through the resistor R3 becomes an output current.

As described above, in the voltage-current conversion circuit 11, since the current mirror circuit is constituted from the N-channel depletion-type transistors M1, M2, and the resistors R2, R4 for biasing the source voltages higher than the substrate voltage, respectively, the threshold voltages can be set higher than 0 V and lower than those of enhancement-type transistors, leading to an accurate conversion of a voltage between the input terminals to a current even if the voltage becomes low.

Figure 2:
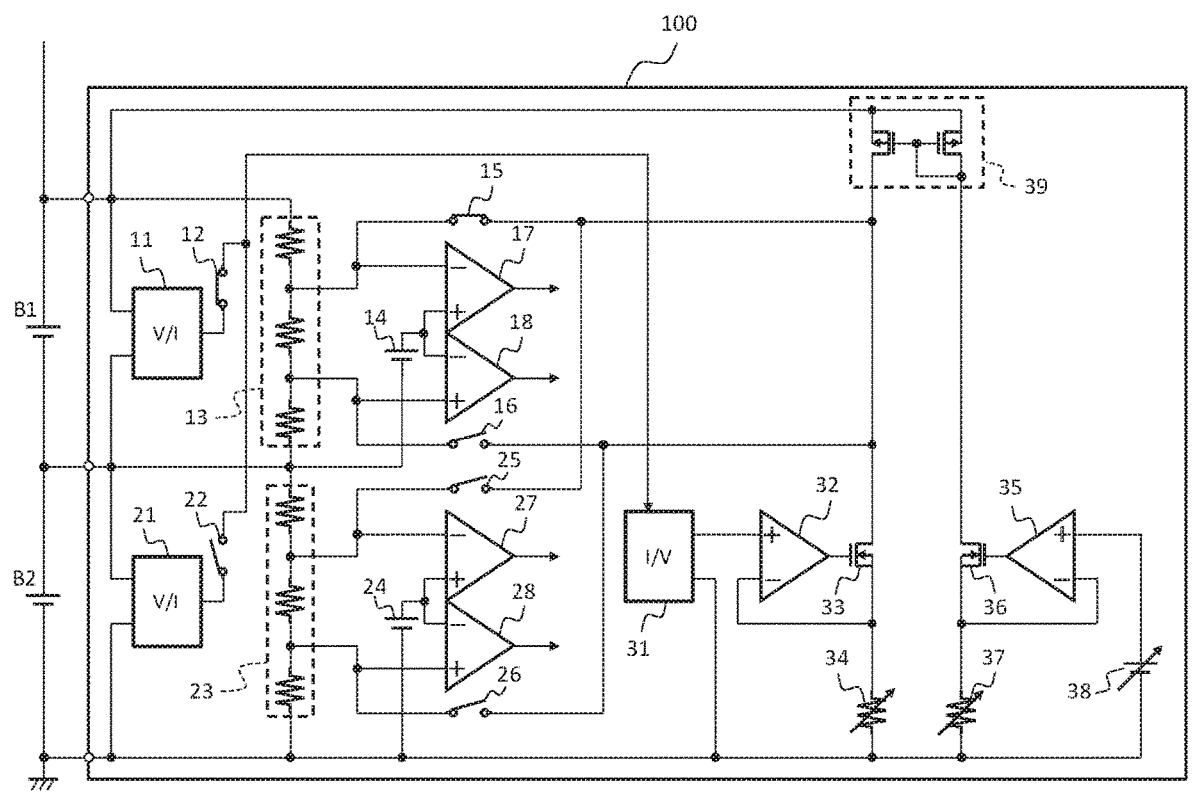
FIG. 2 is a block diagram illustrating a charge-discharge control device including a failure diagnosis circuit.

FIG. 2 is a block diagram illustrating a charge-discharge control device 100 including a failure diagnosis circuit.

The charge-discharge control device 100 includes voltage-current conversion circuits 11, 21, switches 12, 15, 16, 22, 25, 26, resistance circuits 13, 23, reference voltage circuits 14, 24, 38, comparators 17, 18, 27, 28, a current-voltage conversion circuit 31, operational amplifiers 32, 35, MOS transistors 33, 36, resistors 34, 37, and a current mirror circuit 39.

The comparator 17 detects over-discharge of a secondary battery B1 based on the voltage supplied from the resistance circuit 13 and the voltage of the reference voltage circuit 14. The comparator 18 detects similarly over-discharge of the secondary battery B1. The comparator 27 detects over-discharge of a secondary battery B2 based on the voltage supplied from the resistance circuit 23 and the voltage of the reference voltage circuit 24. The comparator 28 detects similarly over-discharge of the secondary battery B2. Though not illustrated here, a control circuit and the like for controlling the charging and discharging of the secondary batteries by signals from these comparators are also included.

In diagnosing failure of the circuit for detecting the voltage of the secondary battery B1, the charge-discharge control device 100 operates as follows.

The voltage-current conversion circuit 11 and the current-voltage conversion circuit 31 convert the voltage of the secondary battery B1 to a voltage based on the ground voltage. The operational amplifiers 32, 35, the MOS transistors 33, 36, the resistors 34, 37, and the current mirror circuit 39 generate a current for failure diagnosis based on the voltage to make the current flow through the resistance circuit 13 by means of the switch 15 or the switch 16. The comparators 17, 18 detect a circuit failure based on the voltage of the resistance circuit 13 at the instant.

Figure 3:
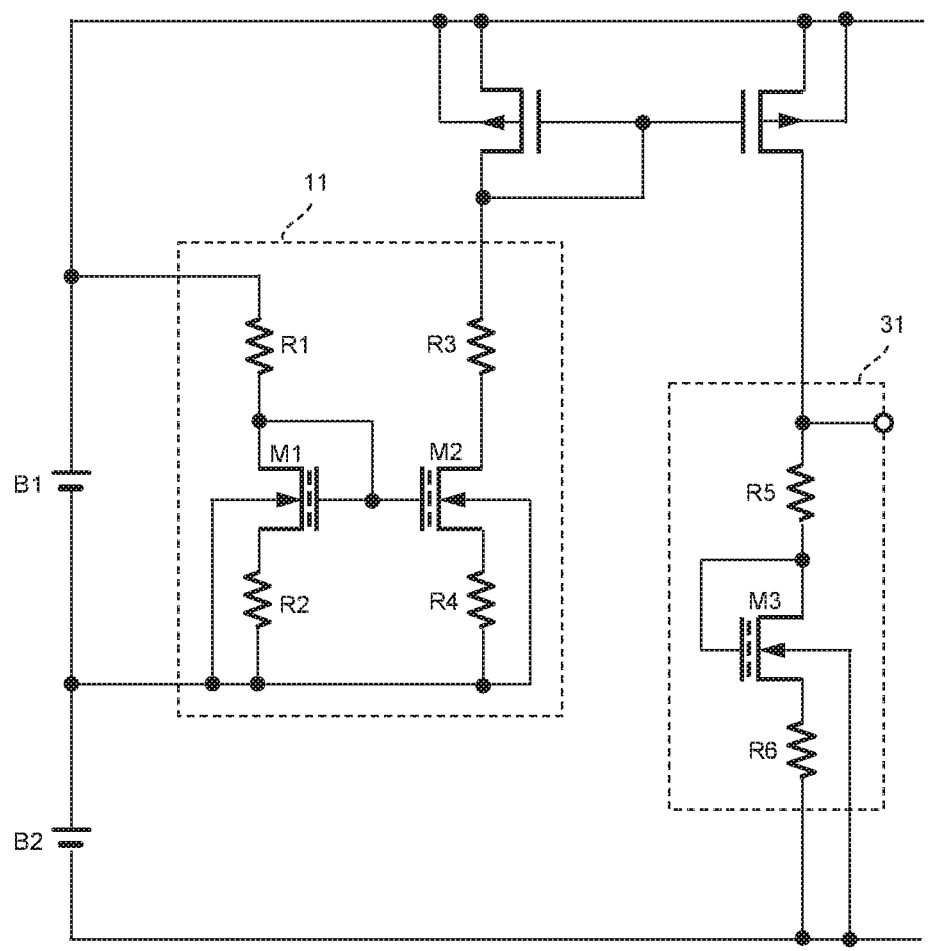
FIG. 3 is a circuit diagram illustrating the voltage-current conversion circuit and a current-voltage conversion circuit used in the charge-discharge control device of FIG. 2 according to the embodiment of the present invention.

FIG. 3 is a circuit diagram illustrating a voltage-current conversion circuit and a current-voltage conversion circuit, which can be used in the charge-discharge control device of FIG. 2, according to the embodiment of the present invention. The voltage-current conversion circuit 11 and the current-voltage conversion circuit 31 can be connected through a current mirror circuit as in FIG. 3 to constitute a reference potential conversion circuit.

Since the voltage-current conversion circuit 11 is the same as that in FIG. 1, the description thereof will be omitted.

The current-voltage conversion circuit 31 includes resistors R5, R6, and an N-channel depletion-type transistor M3. The resistor R5 has one end connected to an output terminal of the current mirror circuit and the other end connected to the drain and the gate of the transistor M3. The transistor M3 has a source connected to one end of the resistor R6 and a substrate connected to the ground terminal. The other end of the resistor R6 is connected to the ground terminal. The resistor R5 is a resistor for current-voltage conversion, and one end thereof is a voltage output terminal.

The voltage-current conversion circuit 11 has a first voltage input terminal connected to the positive terminal of the secondary battery B1, a second voltage input terminal connected to the negative terminal of the secondary battery B1, and a current output terminal connected to an input terminal of the current mirror circuit.

In the reference potential conversion circuit of FIG. 3, the voltage-current conversion circuit 11 converts the voltage of the secondary battery B1 to a current, and the current-voltage conversion circuit 31 converts the current to a voltage based on the potential of the ground terminal.

Since the current-voltage conversion circuit 31 has the same structure as the circuit to convert the voltage to the current in the voltage-current conversion circuit 11, the current of the voltage-current conversion circuit 11 can be reconverted to the voltage accurately.

While the embodiment of the present invention has been described, the present invention is not limited to the embodiment, and various changes can be made without departing from the scope of the present invention. For example, each of the resistors R2, R4, R6 may be constructed by a constant current source because the resistors serve to bias the source voltages of the transistors M1, M2, M3 higher than the substrate voltage.

What is claimed is:

1. A voltage-current conversion circuit configured to covert a voltage at an input terminal to a current and output the current from an output terminal, comprising:
   a voltage-current conversion resistor connected to the input terminal; and
   a current mirror circuit which mirrors a current supplied from the voltage-current conversion resistor, the current mirror circuit comprising a depletion-type transistor, a source voltage of which is biased higher than a substrate voltage of the depletion-type transistor.

2. The voltage-current conversion circuit according to claim 1, wherein the depletion-type transistor is so constructed that a substrate is grounded and that a source is grounded through a resistor.

3. The voltage-current conversion circuit according to claim 1, wherein the depletion-type transistor is so constructed that a substrate is grounded and that a source is grounded through a current source.

4. A charge-discharge control device, comprising:
a failure diagnosis circuit configured to include the voltage-current conversion circuit according to claim 1, and a current-voltage conversion circuit which converts the current of the voltage-current conversion circuit to a voltage based on a ground terminal.

5. The charge-discharge control device according to claim 4, wherein the current-voltage conversion circuit comprises:
a current-voltage conversion resistor which converts the current of the voltage-current conversion circuit to an output voltage; and
a depletion-type transistor provided between the current-voltage conversion resistor and the ground terminal, a source voltage of which is biased higher than a substrate voltage of the depletion-type transistor of the current-voltage conversion circuit.

* * * * *